(12) United States Patent
Shim

(10) Patent No.: US 8,314,436 B2
(45) Date of Patent: Nov. 20, 2012

(54) LIGHT EMITTING DEVICE AND MANUFACTURING METHOD THEREOF

(75) Inventor: Sang Kyun Shim, Jeonju-si (KR)

(73) Assignee: LG Innotek Co., Ltd., Seoul (KR)

( * ) Notice: Subject to any disclaimer, the term of this patent is extended or adjusted under 35 U.S.C. 154(b) by 360 days.

(21) Appl. No.: 12/123,910

(22) Filed: May 20, 2008

(65) Prior Publication Data

US 2008/0290346 A1 Nov. 27, 2008

(30) Foreign Application Priority Data

May 21, 2007 (KR) .................. 10-2007-0049026

(51) Int. Cl.
*H01L 33/22* (2010.01)
(52) U.S. Cl. .................. 257/94; 257/76; 257/E33.025; 257/E33.074
(58) Field of Classification Search .......... 257/76
See application file for complete search history.

(56) References Cited

U.S. PATENT DOCUMENTS

| 6,617,182 B2* | 9/2003 | Ishida et al. ............ 438/22 |
| 6,821,804 B2* | 11/2004 | Thibeault et al. ............ 438/29 |
| 7,190,001 B2* | 3/2007 | Taki ............ 257/79 |
| 7,683,386 B2* | 3/2010 | Tanaka et al. ............ 257/88 |
| 2005/0001227 A1* | 1/2005 | Niki et al. ............ 257/98 |
| 2005/0035359 A1* | 2/2005 | Ishida et al. ............ 257/94 |
| 2006/0192207 A1* | 8/2006 | Wook Shim et al. ............ 257/79 |
| 2007/0145406 A1* | 6/2007 | Han et al. ............ 257/103 |

FOREIGN PATENT DOCUMENTS

WO  WO 2006022497  * 3/2006

* cited by examiner

*Primary Examiner* — Matthew W Such
*Assistant Examiner* — Abul Kalam
(74) *Attorney, Agent, or Firm* — Birch, Stewart, Kolasch & Birch, LLP

(57) ABSTRACT

Provided are a light emitting device and a manufacturing method thereof. The light emitting device comprises a first conductive semiconductor layer with a lower surface being uneven in height, an active layer on the first conductive semiconductor layer, and a second conductive semiconductor layer on the active layer.

14 Claims, 5 Drawing Sheets

LIGHT EMITTING DEVICE AND MANUFACTURING METHOD THEREOF

CROSS-REFERENCE TO RELATED APPLICATIONS

The present application claims priority under 35 U.S.C. 119 and 35 U.S.C. 365 to Korean Patent Application No. 10-2007-0049026 (filed on May 21, 2007), which is hereby incorporated by reference in its entirety.

BACKGROUND

The present embodiments relate to light emitting devices and manufacturing methods thereof.

Light emitting diodes (LED) using nitride material semiconductors are being widely used as light emitting devices, but require much research and development to improve light emitting efficiency.

Embodiments provide light emitting devices with improved light emitting efficiency, and manufacturing methods thereof.

Embodiments also provide light emitting devices with minimal internal light loss.

In an embodiment, a light emitting device comprises: a first conductive semiconductor layer with a lower surface being uneven in height, an active layer on the first conductive semiconductor layer, and a second conductive semiconductor layer on the active layer.

In an embodiment, a light emitting device comprises: a substrate, a first buffer layer on portions of the substrate, a first undoped GaN layer on the first buffer layer, a first conductive semiconductor layer over the substrate, an active layer over the first conductive semiconductor layer, and a second conductive semiconductor layer over the active layer.

In an embodiment, a method for manufacturing a light emitting device, the method comprising: forming a first buffer layer and a first un-doped GaN layer on a substrate, exposing a portion of the substrate through etching the substrate with the first buffer layer and the first un-doped GaN layer formed thereon, and forming a first conductive semiconductor layer, an active layer, and a second conductive semiconductor layer over the substrate.

The details of one or more embodiments are set forth in the accompanying drawings and the description below. Other features will be apparent from the description and drawings, and from the claims.

DETAILED DESCRIPTION OF THE EMBODIMENTS

Figure 1:
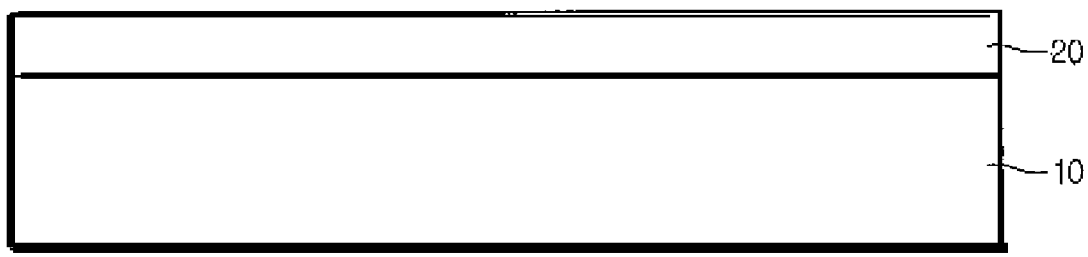
FIGS. 1 to 8 are views for describing light emitting devices and manufacturing methods thereof according to present embodiments.

In the following description, it will be understood that when a layer (or film) is referred to as being 'on' another layer or substrate, it can be directly on the other layer or substrate, or indirectly on the other layer, with intervening layers present. Further, it will be understood that when a layer is referred to as being 'under' another layer, it can be directly under the other layer, or indirectly under the other layer, with one or more intervening layers present.

In the drawings, the respective layers may be exaggerated in terms of thickness and size, omitted, or schematically shown, for the sake of explanatory convenience and concision. Also, the respective elements are not depicted to scale, overall.

Reference will now be made in detail to light emitting devices and manufacturing methods thereof according to present embodiments, examples of which are illustrated in the accompanying drawings.

FIGS. 1 to 8 are views for describing light emitting devices and manufacturing methods thereof according to present embodiments.

Referring to FIG. 1, a substrate 10 is prepared, and a first buffer layer 20 is formed on the substrate 10.

The substrate 10 may be formed of one of sapphire ($Al_2O_3$), silicon carbide (SiC), silicon (Si), gallium arsenic (GaAs), zinc oxide (Zno), and magnesium oxide (MgO), and the first buffer layer 20 may be formed of one of an AlInN structure, an AlInN/GaN stacked structure, an $In_xGa_{1-x}N$/GaN stacked structure, and an $Al_xIn_yGa_{1-(x+y)N/Inx}Ga_{1-x}N$/GaN stacked structure.

Figure 2:
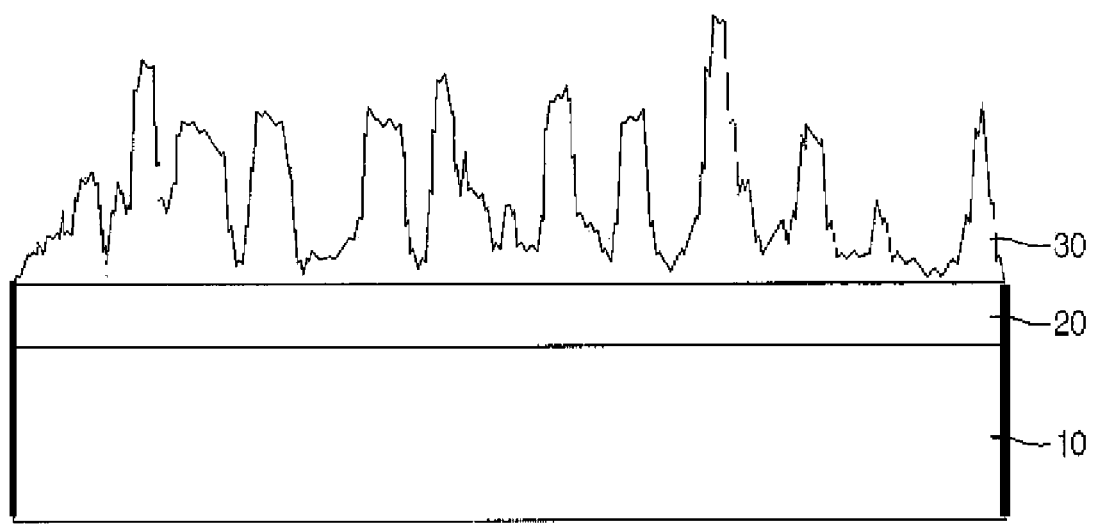

Referring to FIG. 2, a first un-doped GaN layer 30 is formed on the first buffer layer 20.

The first un-doped GaN layer 30 is formed by supplying 40~50 sccm of trimethylgallium (TMGa) and 30,000 sccm of $NH_3$ at a growing temperature of 1040~1050° C. Here, a purge gas and carrier gas of $N_2$ and $H_2$ may be used.

While $NH_3$ and trimethylgallium (TMGa) are generally supplied at a ratio of 1:0.005 to grow an un-doped GaN layer, in the present embodiment, $NH_3$ and trimethylgallium (TMGa) are supplied at a ratio of between 1:0.0013 and 1:0.0016 to grow the first un-doped GaN layer 30.

The first un-doped GaN layer 30 is unevenly formed on the first buffer layer 20, to resemble an uneven arrangement of hexagonal rods. The first un-doped GaN layer 30 may be formed at a thickness of approximately 1 μm.

Figure 3:
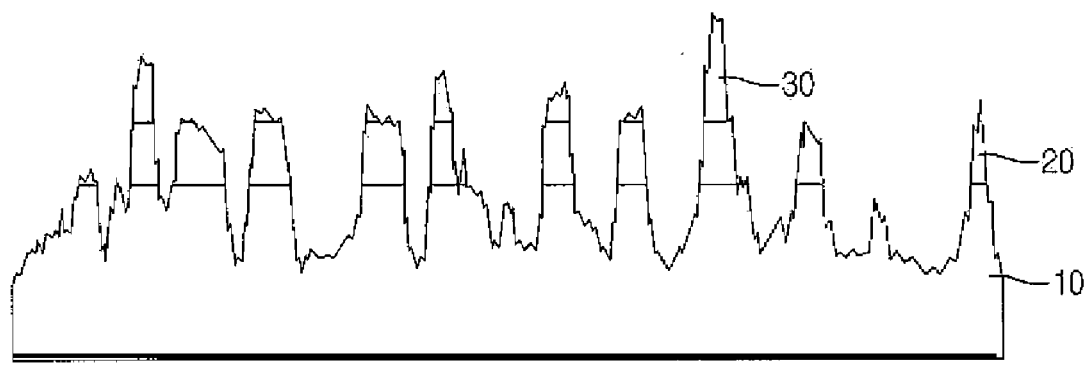

Referring to FIG. 3, substrate 10 with the first un-doped GaN layer 30 and the first buffer layer 20 formed thereon is cooled at a temperature of 15~25° C., after which a dry etch is performed without the use of a mask. Accordingly, the substrate 10, the first buffer layer 20, and the first un-doped GaN layer 30 are unevenly etched.

The dry etch may be performed in an inductively coupled plasma (ICP) etching apparatus.

The etch conditions may be, for example, 1 mTorr of pressure, 25 sccm of $BCl_3$ gas, 700 W of ICP power, 230 W of chuck power, and 3 minutes of etching time.

As shown in FIG. 3, in portions where the first un-doped GaN layer 30 is formed thin, recesses are formed in the substrate 10 where portions of first buffer layer 20 and the substrate 10 are removed.

Also, in portions where the first un-doped GaN layer 30 is formed thick, only the first buffer layer 20 is present on the substrate 10, or the first buffer layer 20 and the first un-doped GaN layer 30 are present.

Figure 4:
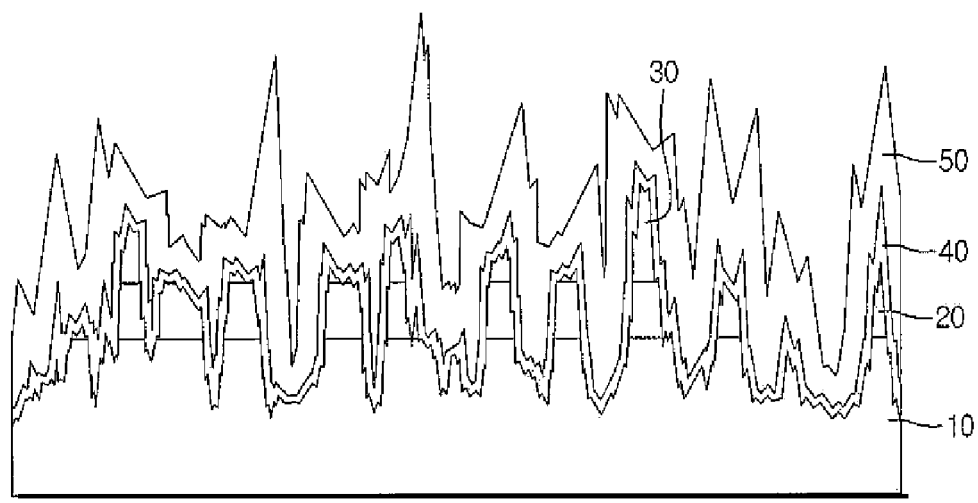

Referring to FIG. 4, after the dry etch is performed, a second buffer layer 40 and a second un-doped GaN layer 50 are formed.

The second buffer layer 40 may be formed of one of an AlInN structure, an AlInN/GaN stacked structure, an $In_xGa_{1-x}N$/GaN stacked structure, an $Al_xInyGa_{1-(x+y)}N/In_xGa_{1-x}N$/GaN stacked structure, an InGaN/GaN superlattice structure, and an AlGaN/GaN superlattice structure.

The second un-doped GaN layer 50 may be formed by supplying 40~50 sccm of trimethylgallium TMGa and 30,000 sccm of $NH_3$ at a growing temperature of 1040~1050° C.

In another method, the second un-doped GaN layer 50 may be formed by supplying 145 sccm of trimethylgallium TMGa and 30,000 sccm of $NH_3$ at a growing temperature of 1070° C.

Figure 7:
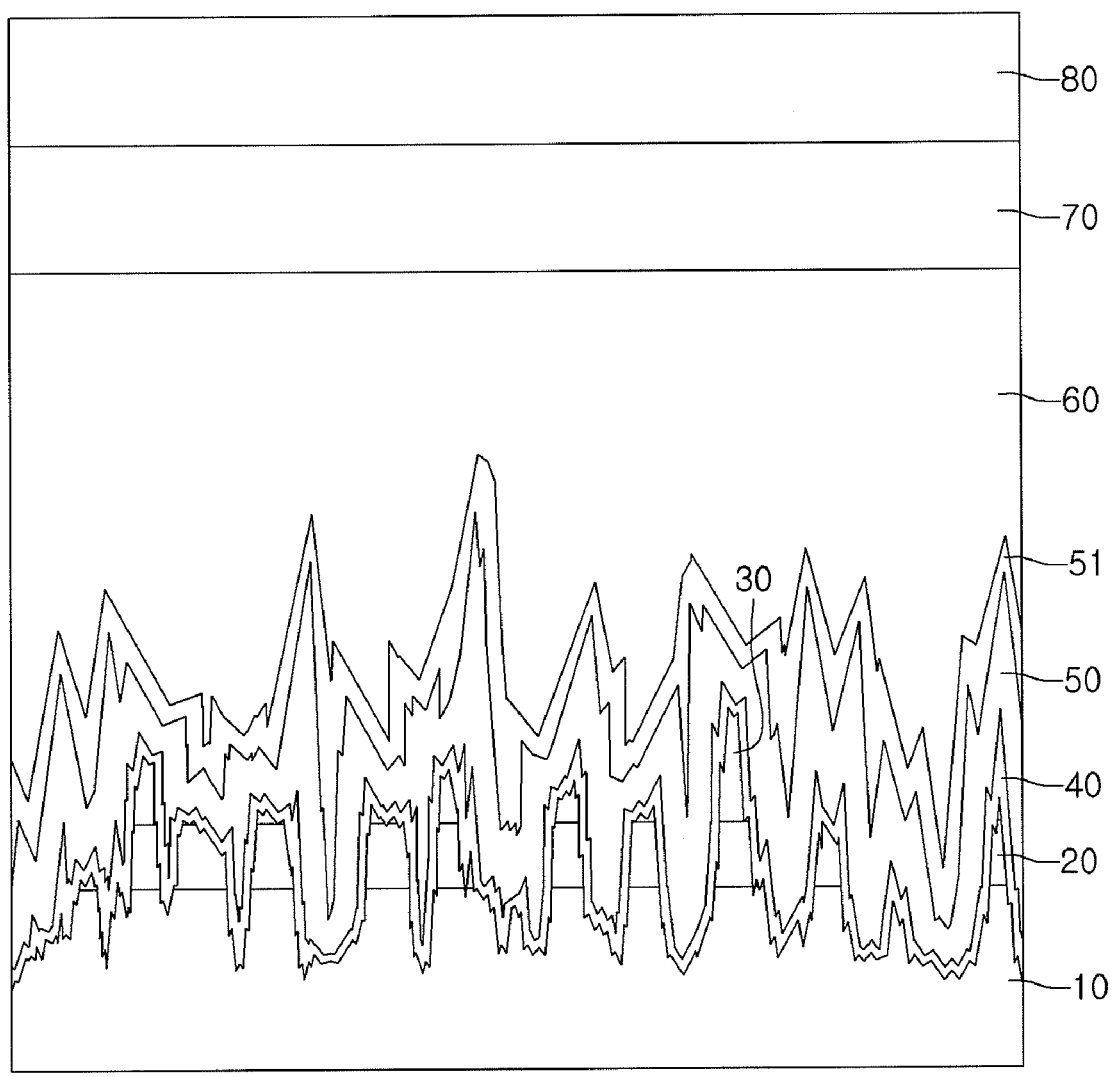
Figure 8:
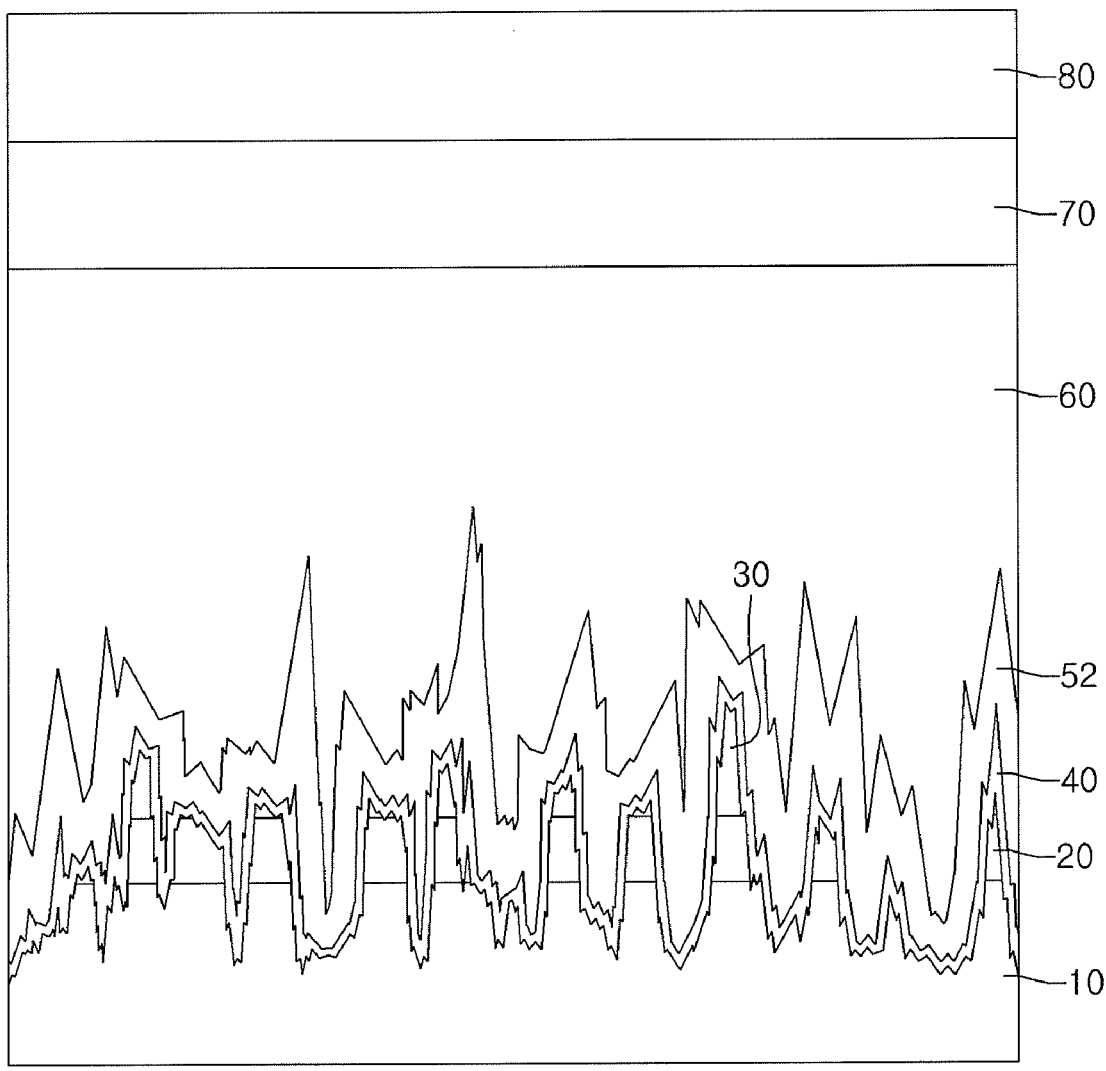

As shown in FIGS. 7-8, either an In-doped GaN layer (51) that is doped with indium (In) may be formed on the second un-doped GaN layer 50, or an In-doped GaN layer (52) doped with In may be formed without forming the second un-doped GaN layer 50.

Thus, portions of the substrate 10 may have the substrate 10, second buffer layer 40, and second un-doped GaN layer 50 formed thereon in a vertical direction.

Also, portions of the substrate 10 may have the substrate 10, second buffer layer 40, and In-doped GaN layer formed thereon in a vertical direction.

Further, portions of the substrate 10 may have the substrate 10, second buffer layer 40, second un-doped GaN layer 50, and In-doped Gar layer formed thereon in a vertical direction.

Still further, portions of the substrate 10 may have the substrate 10, first buffer layer 20, first un-doped GaN layer 30, second buffer layer 40, and second un-doped GaN layer 50 formed thereon in a vertical direction.

Yet further, portions of the substrate 10 may have the substrate 10, first buffer layer 20, first un-doped GaN layer 30, second buffer layer 40, second un-doped GaN layer 50, and In-doped GaN layer formed thereon in a vertical direction.

Even further, portions of the substrate 10 may have the substrate 10, first buffer layer 20, first un-doped GaN layer 30, second buffer layer 40, and In-doped GaN layer formed thereon in a vertical direction.

Yet still further, portions of the substrate 10 may have the substrate 10, first buffer layer 20, second buffer layer 40, and second un-doped GaN layer 50 formed thereon in a vertical direction.

Yet even further, portions of the substrate 10 may have the substrate 10, first buffer layer 20, second buffer layer 40, second un-doped GaN layer 50, and In-doped GaN layer formed thereon in a vertical direction.

Additionally, portions of the substrate 10 may have the substrate 10, first buffer layer 20, second buffer layer 40, and In-doped GaN layer formed thereon in a vertical direction.

Figure 5:
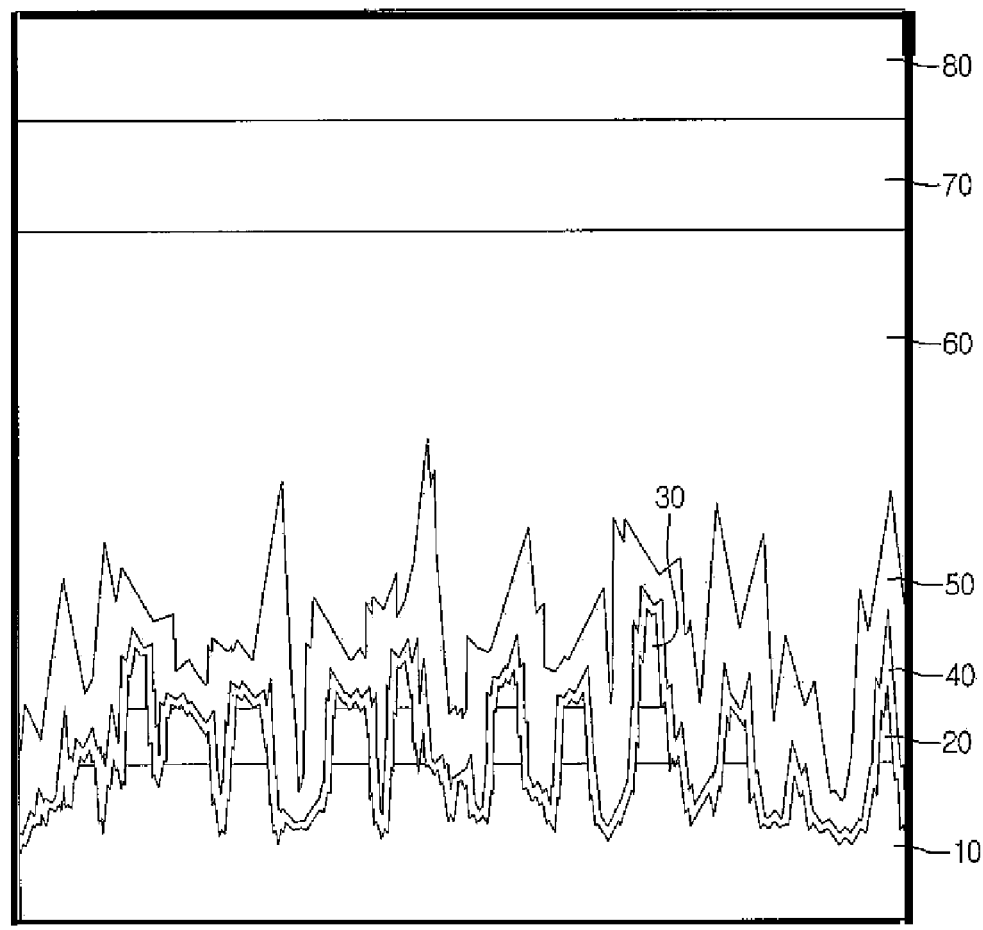

Referring to FIG. 5, a first conductive semiconductor layer 60, an active layer 70, and a second conductive semiconductor layer 80 are sequentially formed.

The first conductive semiconductor layer 60 may be formed as a silicon (Si)-doped GaN layer or an Si—In-co-doped GaN layer. Also, a low-mole $In_xGa_{1-x}N$ layer may be formed on the Si—In co-doped GaN layer.

By, forming the low-mole $In_xGa_{1-x}N$ layer before the active layer 70 is grown, strain on the active layer 70 can be controlled, and quantum efficiency can be increased.

The active layer 70 may be an InGaN layer formed by supplying $NH_3$, trimethylgallium TMGa, and trimethylindium TMIn. For example, the active layer 70 may be formed as an InGaN well layer/InGaN barrier structure with a mole ratio difference in each element of InGaN.

The second conductive semiconductor layer 80 is formed on the active layer 70.

The second conductive semiconductor layer 80 may be formed of a magnesium (Mg) doped GaN layer.

Figure 6:
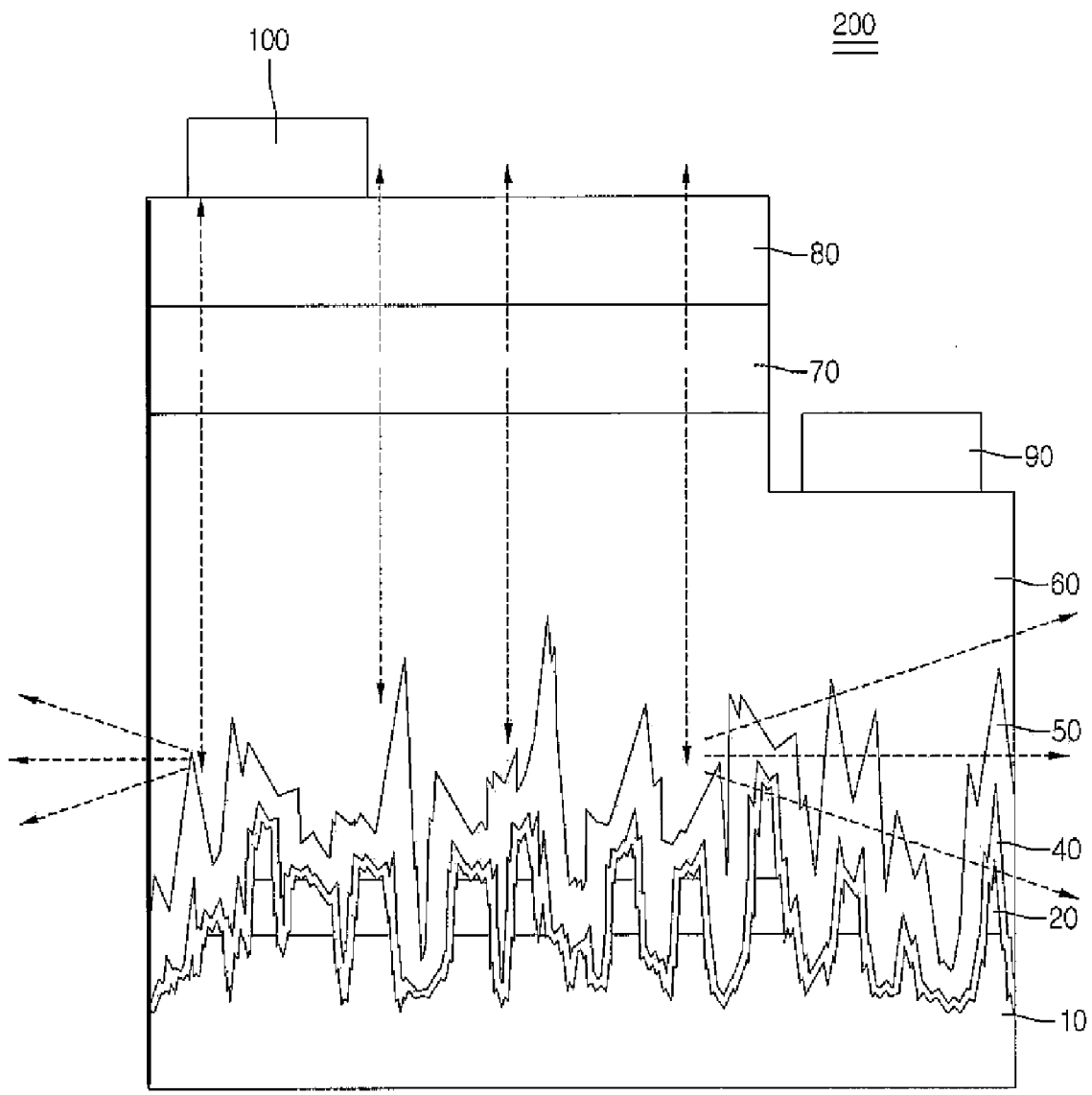

Referring to FIG. 6, the second conductive semiconductor layer 80, the active layer, and the first conductive semiconductor layer 60 are selectively etched.

Then, a first electrode layer 90 is formed on the first conductive semiconductor layer 60, and a second electrode layer 100 is formed on the second conductive semiconductor layer 80.

Accordingly, as shown in FIG. 6, a light emitting device 200 is formed.

The light emitting device 200 emits light generated from the active layer 70 when power is supplied to the first electrode layer 90 and the second electrode layer 100.

In the light emitting device 200 according to present embodiments, because the bottom of the first conductive semiconductor layer 60 is unevenly formed, light emitted downward from light generated from the active layer 70 is not lost within the light emitting device 200, and is scattered in the directions indicated by the arrows and emitted outward.

Accordingly, loss of light within the light emitting device 200 can be minimized, thus increasing light emitting efficiency.

The light emitting device 200 according to present embodiments has a substrate 10 formed with recesses of uneven depths and positions, to induce scattering of light generated by the active region 70 and increase light emitting efficiency.

The light emitting device 200 according to present embodiments includes all or a portion of a first buffer layer 20, a first un-doped GaN layer 30, a second buffer layer 40, a second un-doped GaN layer 50, and an In-doped Gan layer between a substrate 10 and a first conductive semiconductor layer 60, in order to induce scattering of light generated by the active layer 70.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a substrate having an upper surface having irregularly uneven stacked structures protruding in an upward direction from the substrate;
a first conductive semiconductor layer on the substrate and having an irregularly uneven lower surface facing the upper surface of the substrate;
an active layer on the first conductive semiconductor layer; and
a second conductive semiconductor layer on the active layer,
wherein the stacked structures have a lower layer partially formed with the substrate and stacked upper layers on the lower layer,
wherein the stacked upper layers have different materials from each other,
wherein the lower layer of each stacked structure is separate from each other, and the stacked upper layers cover the lower layer of the stacked structures continuously, wherein the substrate includes flat portions and groove portions formed at between the flat portions, and wherein the lower layer is only stacked on the flat portions of the substrate.

2. The light emitting device according to claim 1, wherein the lower layer comprises:

a buffer layer and an un-doped GaN (gallium-nitride) layer on portions of the substrate.

3. The light emitting device according to claim 1, wherein the stacked upper layers comprise:

a buffer layer and an In (indium)-doped GaN layer between portions of the substrate and the first conductive semiconductor layer.

4. The light emitting device according to claim 1, wherein the lower layer and the stacked upper layers comprise:

a first buffer layer, a second buffer layer, and an un-doped GaN layer between portions of the substrate and the first conductive semiconductor layer.

5. The light emitting device according to claim 1, wherein the lower layer and the stacked upper layers comprise:

a first buffer layer, a second buffer layer, and an In-doped GaN layer between portions of the substrate and the first conductive semiconductor layer.

6. The light emitting device according to claim 1, wherein the lower layer and the stacked upper layers comprise:

a first buffer layer, a first un-doped GaN layer, a second buffer layer, and a second un-doped GaN layer between portions of the substrate and the first conductive semiconductor layer.

7. The light emitting device according to claim 1, wherein the lower layer and the stacked upper layers comprise:

a first buffer layer, an un-doped GaN layer, a second buffer layer, and an In-doped GaN layer between portions of the substrate and the first conductive semiconductor layer.

8. A light emitting device, comprising:

a substrate having an upper surface having irregularly uneven stacked structures protruding in an upward direction from the substrate;

a first conductive semiconductor layer on the substrate and having an irregularly uneven lower surface facing the upper surface of the substrate;

an In-GaN semiconductor layer on the first conductive semiconductor layer;

an active layer on the In-GaN semiconductor layer; and a second conductive semiconductor layer on the active layer, wherein the stacked structures have a lower layer partially formed with the substrate and stacked upper layers on the lower layer, wherein the stacked upper layers have different materials from each other, and wherein the lower layer of each stacked structure is separate from each other, and the stacked upper layers cover the lower layer of the stacked structures continuously, wherein the substrate includes flat portions and groove portions formed at between the flat portions, and wherein the lower layer is only stacked on the flat portions of the substrate.

9. The light emitting device according to claim 8, wherein the lower layer comprises:

a buffer layer and an un-doped GaN (gallium-nitride) layer on portions of the substrate.

10. The light emitting device according to claim 8, wherein the lower layer comprises:

a buffer layer between portions of the substrate and the first conductive semiconductor layer.

11. The light emitting device according to claim 8, wherein the lower layer and the stacked upper layers comprise:

a sequence of a first buffer layer, a second buffer layer, and an un-doped GaN layer between portions of the substrate and the first conductive semiconductor layer.

12. The light emitting device according to claim 8, wherein the lower layer and the stacked upper layers comprise:

a first buffer layer and a second buffer layer between portions of the substrate and the first conductive semiconductor layer.

13. The light emitting device according to claim 8, wherein the lower layer and the stacked upper layers comprise:

a first buffer layer, a first un-doped GaN layer, a second buffer layer, and a second un-doped GaN layer between portions of the substrate and the first conductive semiconductor layer.

14. The light emitting device according to claim 8, wherein the lower layer and the stacked upper layers comprise:

a sequence of a first buffer layer, an un-doped GaN layer and a second buffer layer between portions of the substrate and the first conductive semiconductor layer.

* * * * *